(12) United States Patent
Tsai et al.

(10) Patent No.: US 10,866,375 B2
(45) Date of Patent: *Dec. 15, 2020

(54) LIGHT SOURCE DEVICE AND ELECTRONIC APPARATUS

(71) Applicants: LITE-ON OPTO TECHNOLOGY (CHANGZHOU) CO., LTD., Jiangsu (CN); LITE-ON TECHNOLOGY CORPORATION, Taipei (TW)

(72) Inventors: Hsin-Wei Tsai, Kaohsiung (TW); I-Ju Chen, Taichung (TW); Hou-Yen Tsao, New Taipei (TW); Shu-Hua Yang, Taichung (TW); Yu-Hung Su, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/535,490

(22) Filed: Aug. 8, 2019

(65) Prior Publication Data

US 2020/0049911 A1 Feb. 13, 2020

Related U.S. Application Data

(60) Provisional application No. 62/715,817, filed on Aug. 8, 2018.

(30) Foreign Application Priority Data

Nov. 22, 2018 (CN) .......................... 2018 1 1401708

(51) Int. Cl.
G02B 6/42 (2006.01)
H01S 5/022 (2006.01)
H01S 5/183 (2006.01)

(52) U.S. Cl.
CPC ......... G02B 6/4259 (2013.01); G02B 6/4274 (2013.01); G02B 6/4286 (2013.01); H01S 5/02276 (2013.01); H01S 5/183 (2013.01)

(58) Field of Classification Search
None
See application file for complete search history.

(56) References Cited

U.S. PATENT DOCUMENTS

2015/0103856 A1* 4/2015 Hagino ................. H01S 5/4025
372/44.01
2020/0049339 A1* 2/2020 Tsai ........................ F21V 3/061
2020/0051965 A1* 2/2020 Tsai ..................... H01L 25/167

* cited by examiner

*Primary Examiner* — Ashok Patel
(74) *Attorney, Agent, or Firm* — Li & Cai Intellectual Property (USA) Office

(57) ABSTRACT

A light source device and an electronic apparatus are provided. The light source device includes a substrate, an electrode layer and a surrounding frame disposed on the substrate, a light emitter and a light detector mounted on the electrode layer and located inside of the surrounding frame, and a light permeable member disposed on the surrounding frame and covering the light emitter and the light detector. When the light emitter receives a predetermined current so as to emit an invisible light toward the light permeable member, the light detector receives a reflected part of the invisible light to generate an initial photocurrent. When the light emitter receives a manipulation current so that a detection photocurrent generated from the light detector is less than a first proportion of the initial photocurrent or greater than a second proportion of the initial photocurrent, the light emitter stops receiving the manipulation current.

16 Claims, 16 Drawing Sheets

LIGHT SOURCE DEVICE AND ELECTRONIC APPARATUS

CROSS-REFERENCE TO RELATED PATENT APPLICATION

This application claims priority from U.S. Provisional Patent Application Ser. No. 62/715,817 filed on Aug. 8, 2018, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source device, and more particularly to a light source device and an electronic apparatus each having a reaction mechanism for eye safety.

BACKGROUND OF THE DISCLOSURE

A conventional light source device having a light emitter is not provided with a reaction mechanism that can react according to a damage situation, so that when the conventional light source device is in a specific damage situation, light emitted from the light emitter may harm human eyes.

SUMMARY OF THE DISCLOSURE

In response to the above-referenced technical inadequacies, the present disclosure provides a light source device and an electronic apparatus to effectively improve the issues associated with conventional light source devices.

In one aspect, the present disclosure provides a light source device, which includes a substrate, an electrode layer, a surrounding frame, a light emitter, a light detector, and a light permeable member. The substrate includes a first surface and a second surface opposite to the first surface. The electrode layer is disposed on the first surface of the substrate. The surrounding frame is disposed on the first surface. The light emitter and the light detector are mounted on the electrode layer and are spaced apart from each other, and are located on an inner side of the surrounding frame. The light permeable member is disposed on the surrounding frame and covers the light emitter and the light detector. When the light emitter receives a predetermined current, the light emitter emits an invisible light toward the light permeable member, and the light detector receives a part of the invisible light reflected from the light permeable member so as to generate an initial photocurrent. When the light emitter receives a manipulation current so that a detection photocurrent generated from the light detector is less than a first proportion of the initial photocurrent or greater than a second proportion of the initial photocurrent, the light emitter stops receiving the manipulation current.

In one aspect, the present disclosure provides an electronic apparatus, which includes the above light source device and a control unit that is electrically coupled to the light detector of the light source device and is configured to control the manipulation current to be provided to the light emitter. When the detection photocurrent generated from the light detector is less than the first proportion of the initial photocurrent or greater than the second proportion of the initial photocurrent, the light emitter stops receiving the manipulation current by the control unit.

Therefore, the light source device of the present disclosure can be used to determine the operation of the light emitter according to a detection photocurrent generated from the light detector, thereby preventing the light emitter from emitting light passing through the damaged light permeable member and causing harm to human eyes. Moreover, the light source device can be applied to an apparatus for eye safety (e.g., the electronic apparatus).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 13 is a direct current.

DETAILED DESCRIPTION OF THE EXEMPLARY EMBODIMENTS

Figure 1:
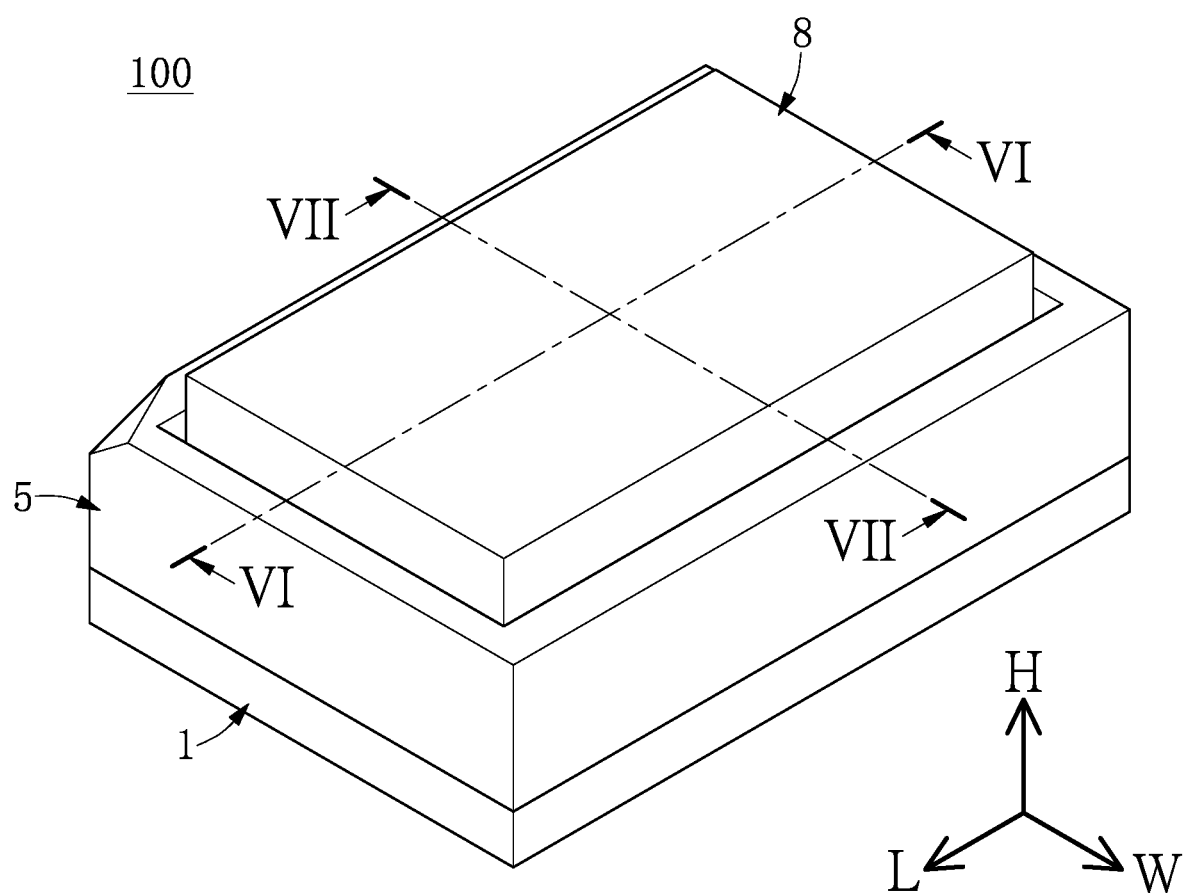
FIG. 1 is a perspective view of a light source device according to a first embodiment of the present disclosure.
Figure 2:
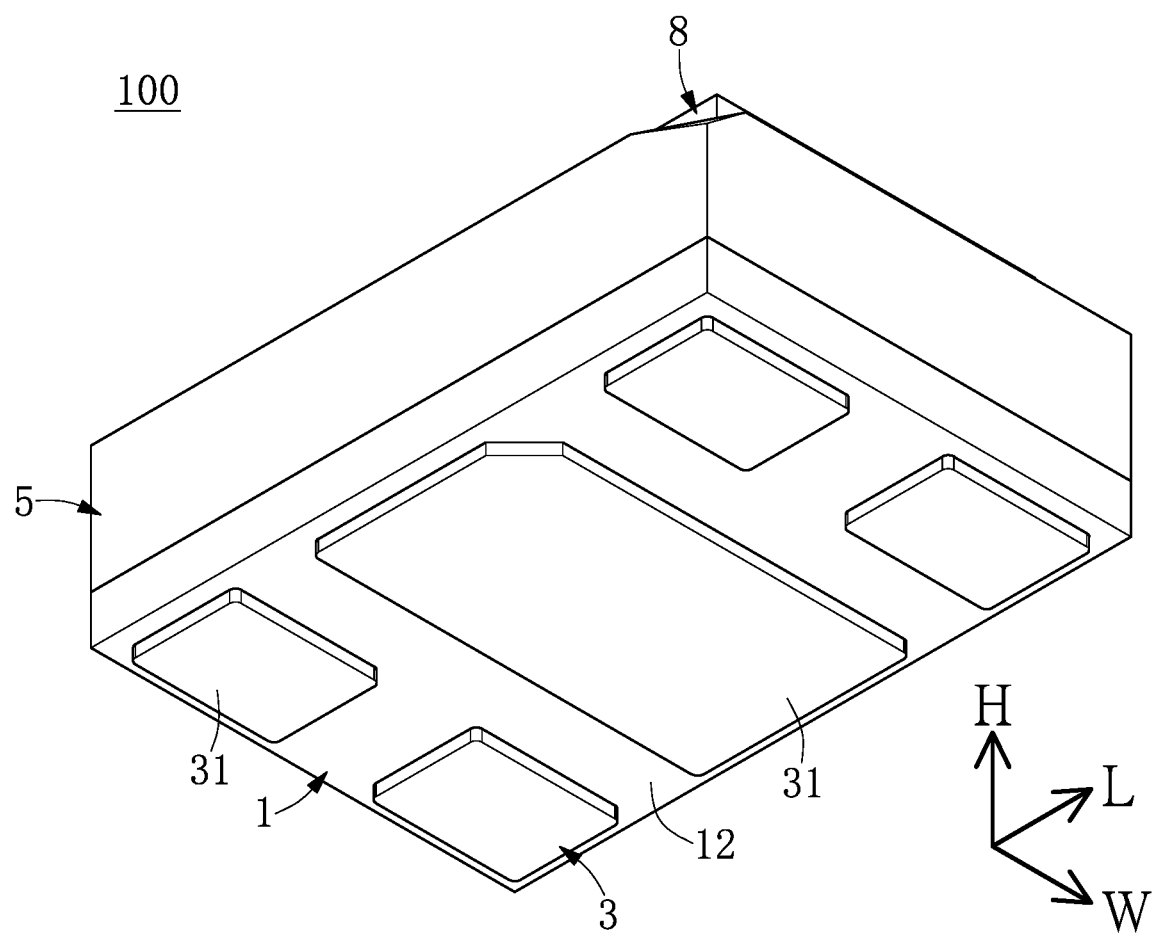
FIG. 2 is a perspective view of the light source device from another view angle.
Figure 3:
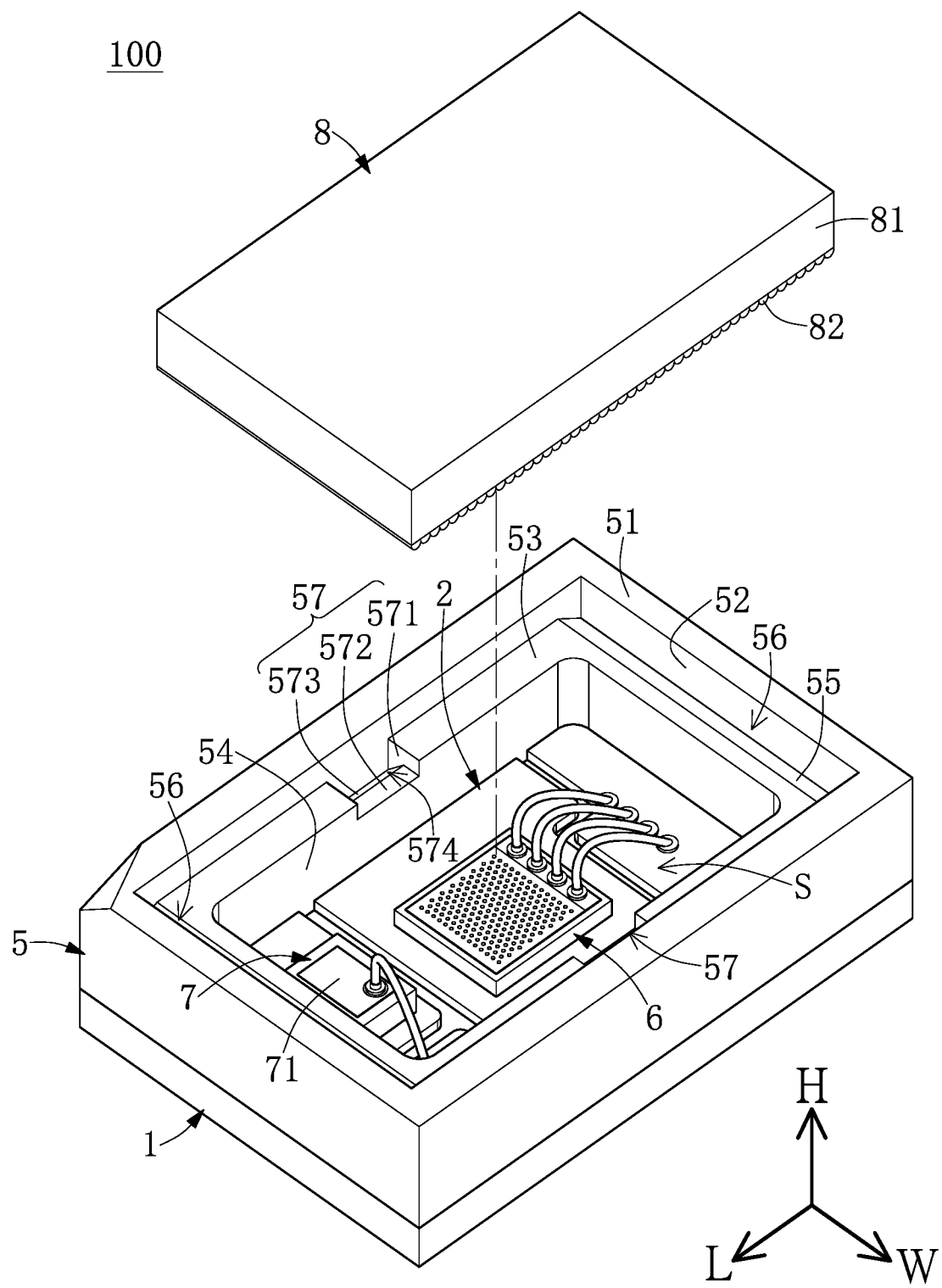
FIG. 3 is an exploded view of FIG. 1 with an adhesive omitted.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 18, which show embodiments of the present disclosure. The present embodiment provides a light source device 100. The light source device 100 of the present embodiment is particularly applied to three-dimensional sensing, but the present disclosure is not limited thereto. As shown in FIG. 1 to FIG. 7, the light source device 100 includes a substrate 1, an electrode layer 2 and a soldering layer 3 both disposed on two opposite sides of the substrate 1, a plurality of conductive posts 4 embedded in the substrate 1, a surrounding frame 5 disposed on the substrate 1, a light emitter 6 and a light detector 7 both spaced apart from each other and mounted on the electrode layer 2, a light permeable member 8 disposed on the surrounding frame 5, and an adhesive 9 connecting and fixing the light permeable member 8 and the surrounding frame 5. The following description describes the structure and connection of each component of the light source device 100.

Figure 5:
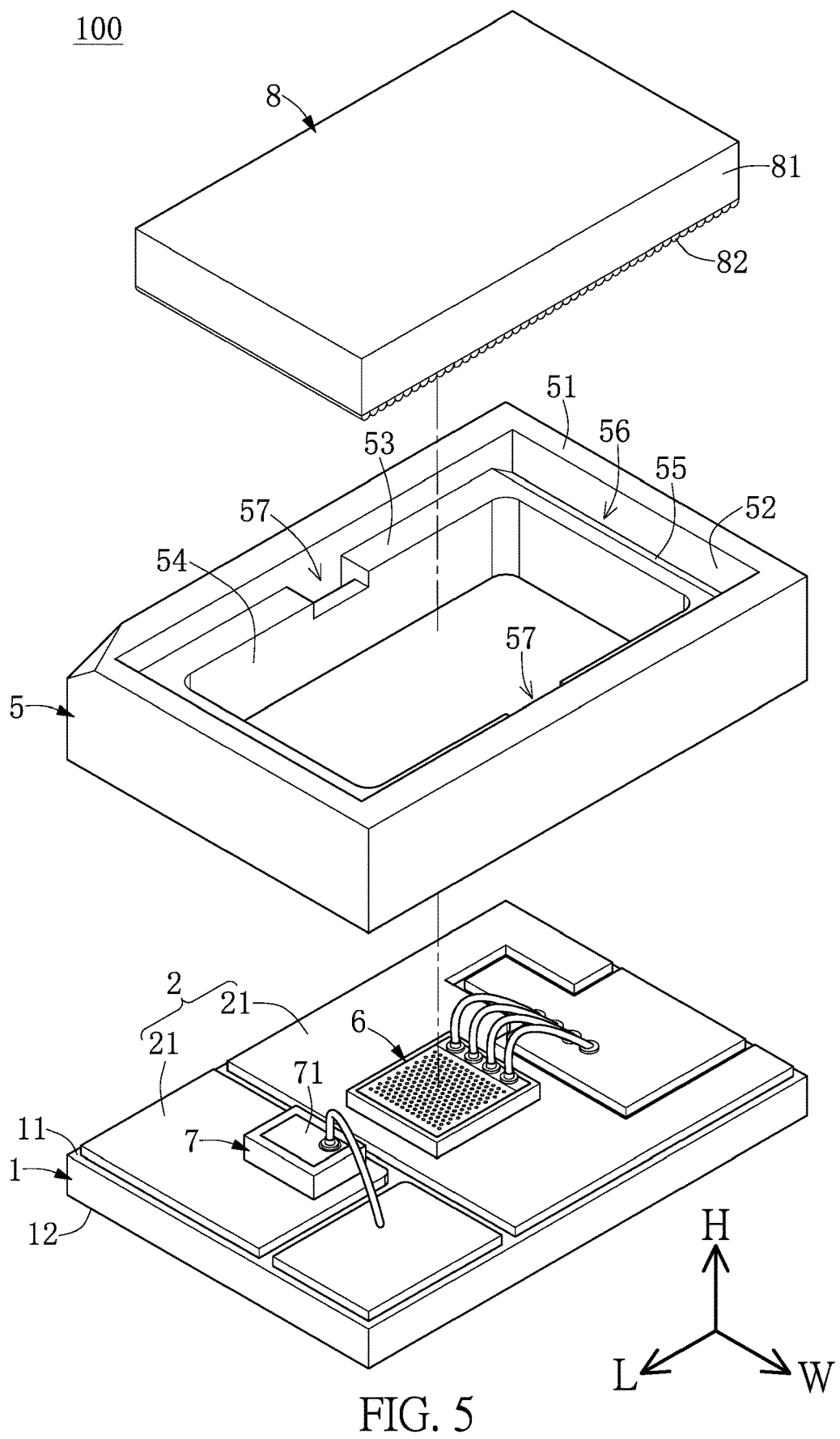
FIG. 5 is an exploded view of FIG. 3 with the adhesive omitted.
Figure 6:
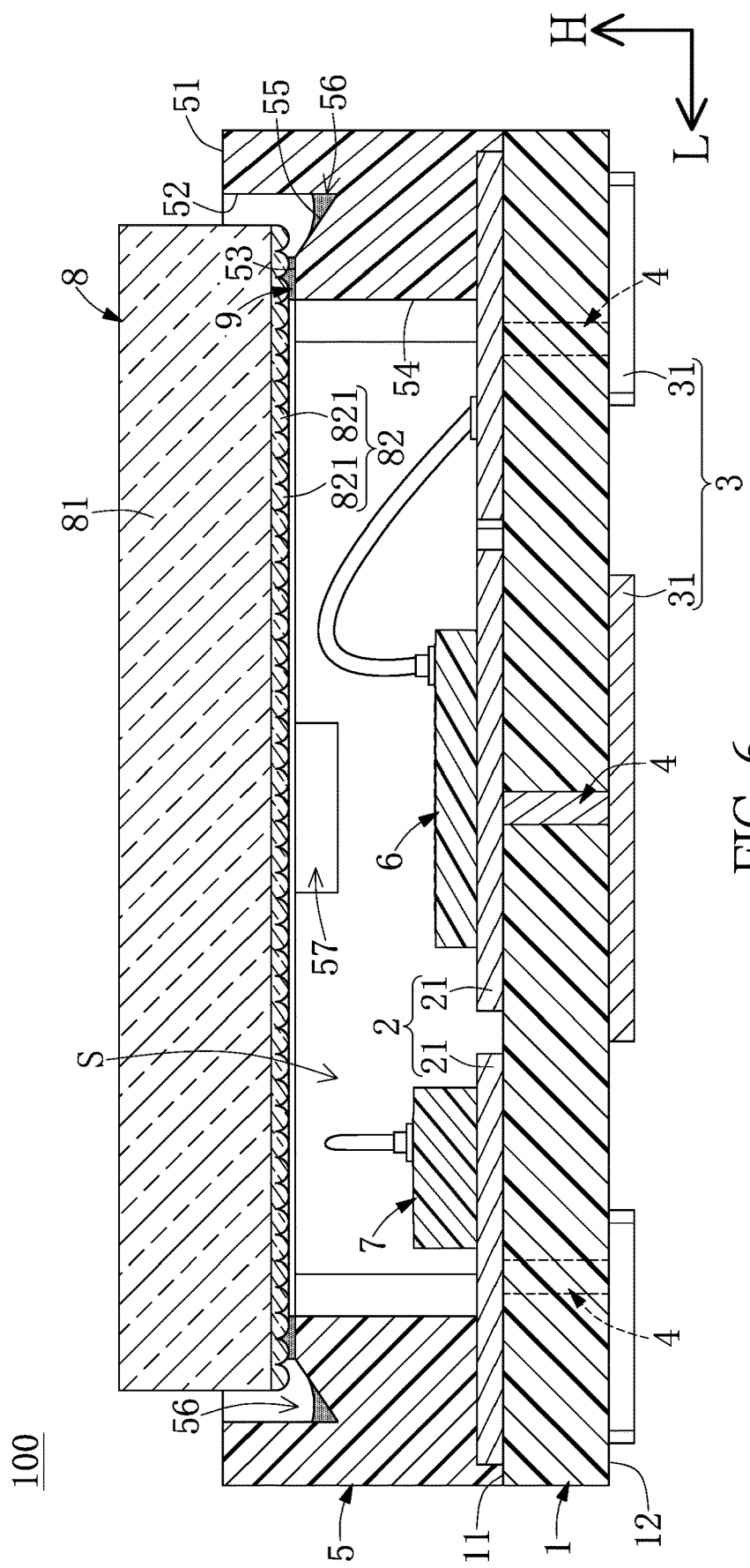
FIG. 6 is a cross-sectional view taken along a cross-section line VI-VI of FIG. 1.
Figure 7:
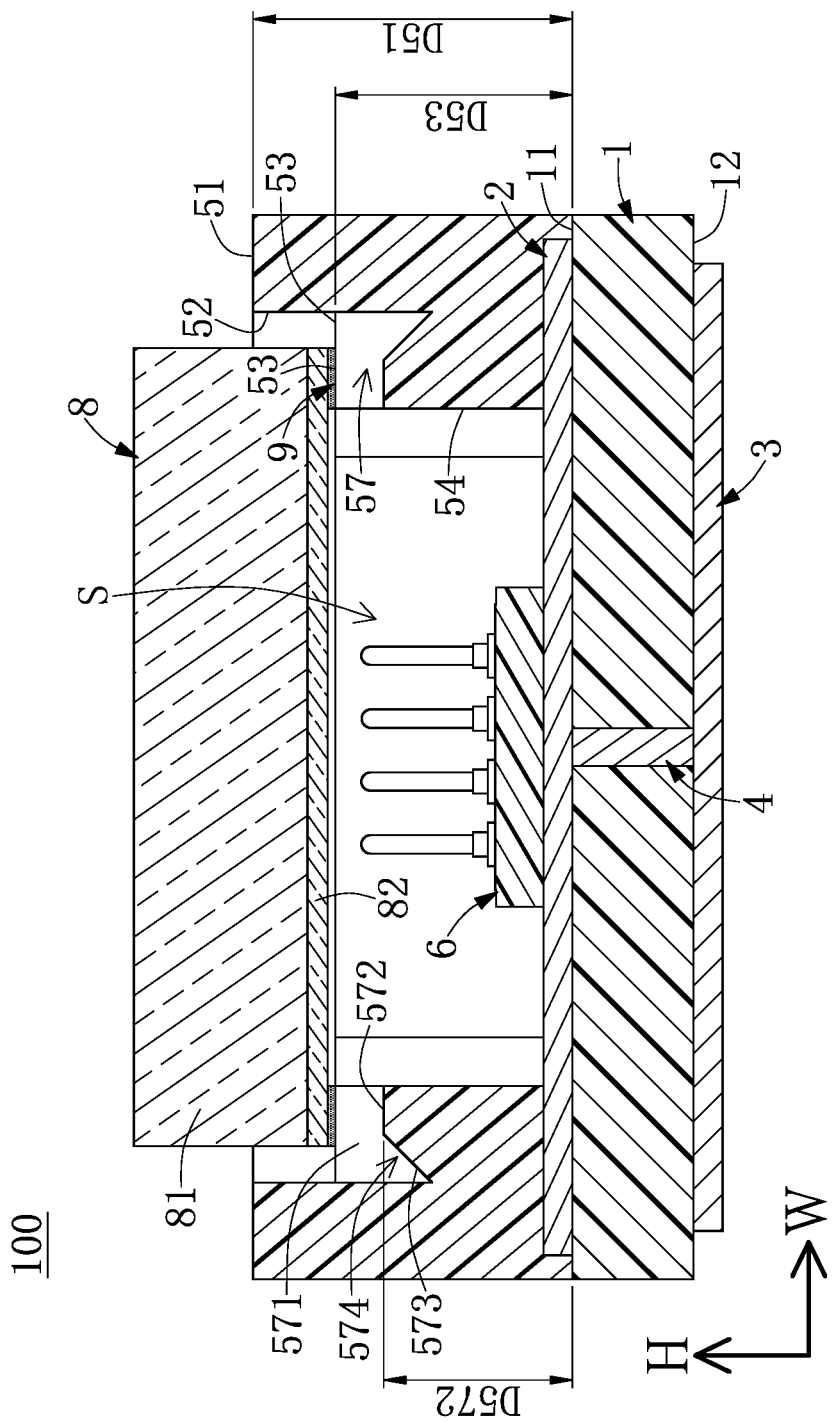
FIG. 7 is a cross-sectional view taken along a cross-section line VII-VII of FIG. 1.
Figure 8:
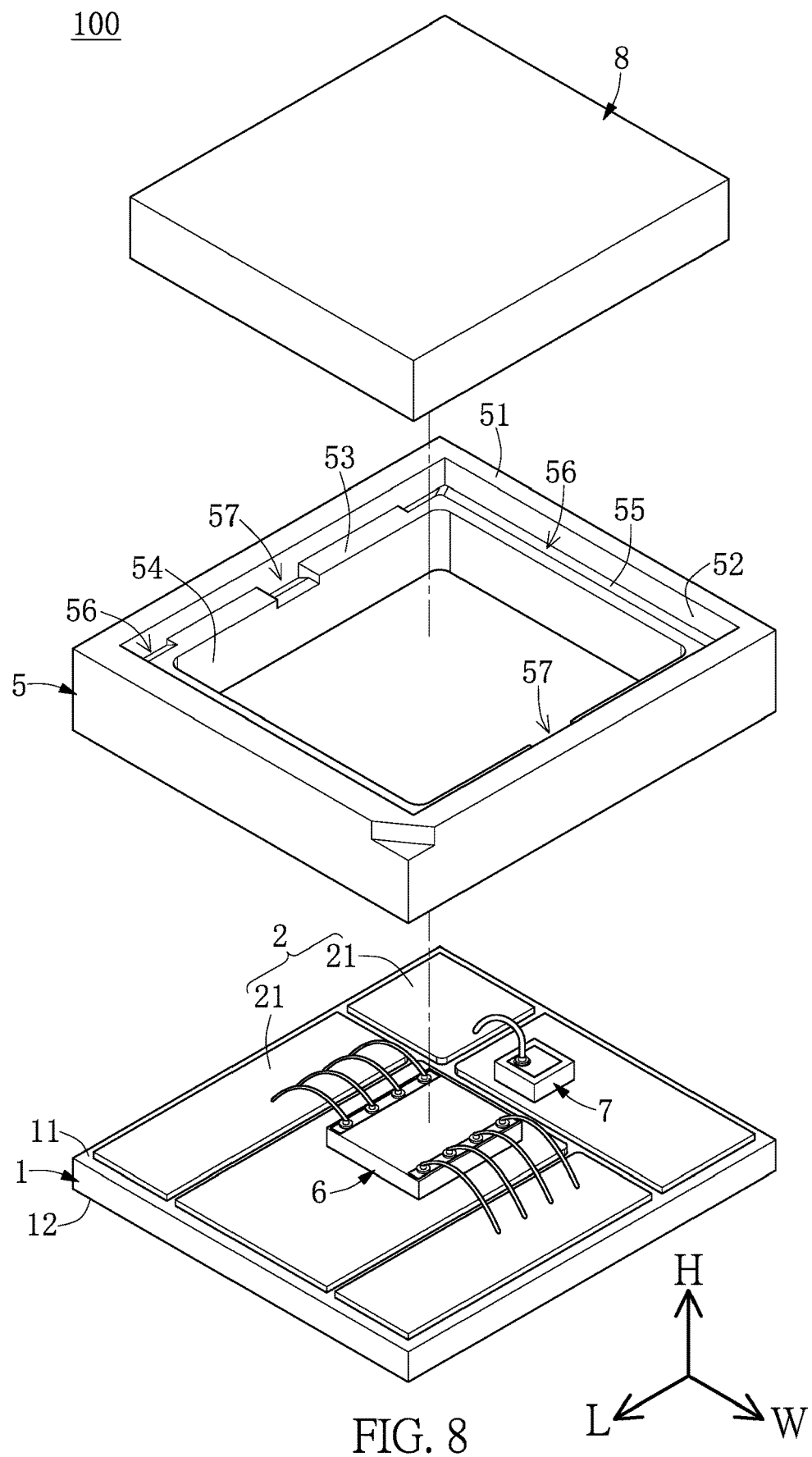
FIG. 8 is an exploded view of a light source device with an adhesive omitted according to a second embodiment of the present disclosure.
Figure 9:
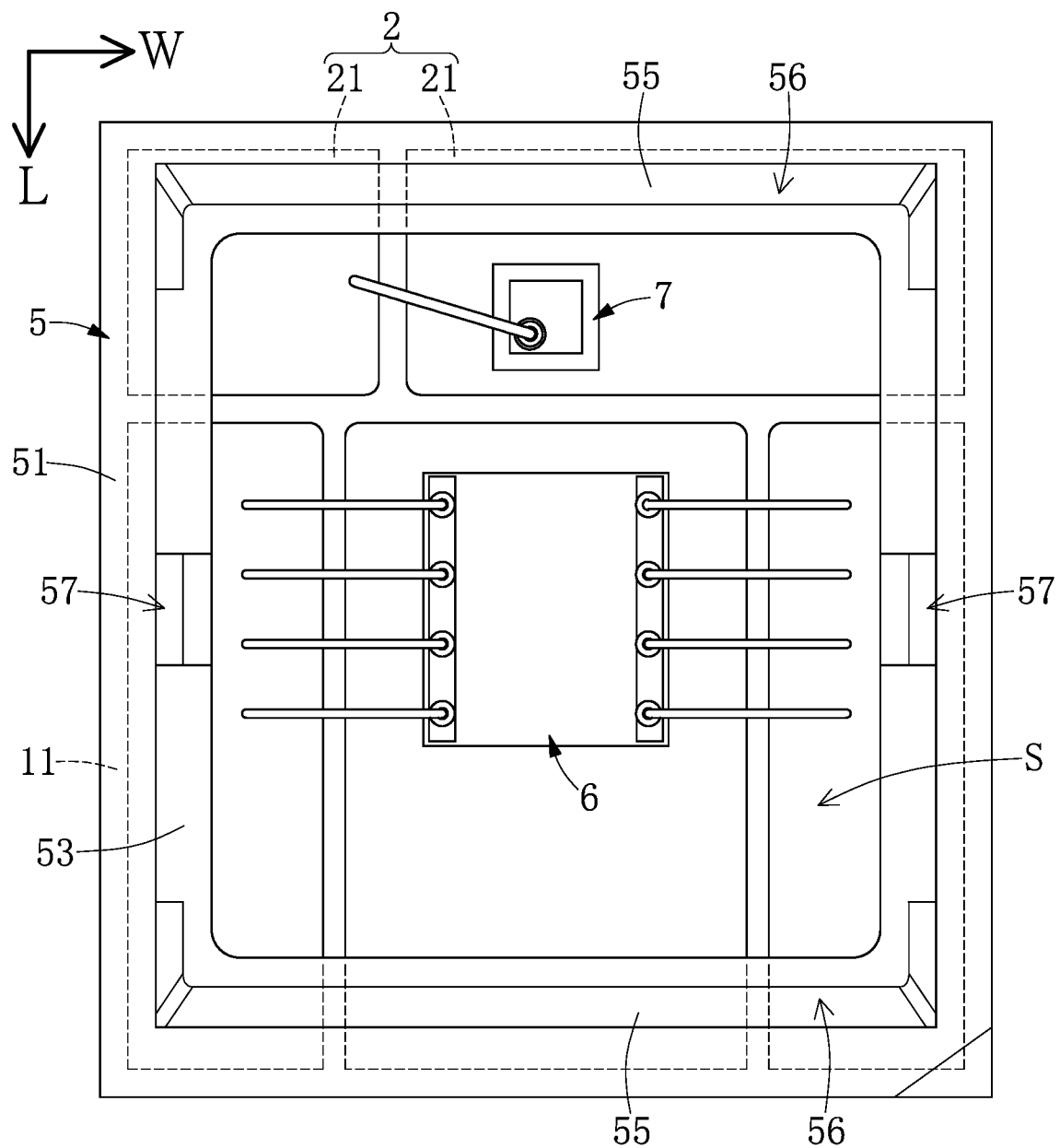
FIG. 9 is a top view of FIG. 8 with the adhesive and a light permeable member both omitted.
Figure 10:
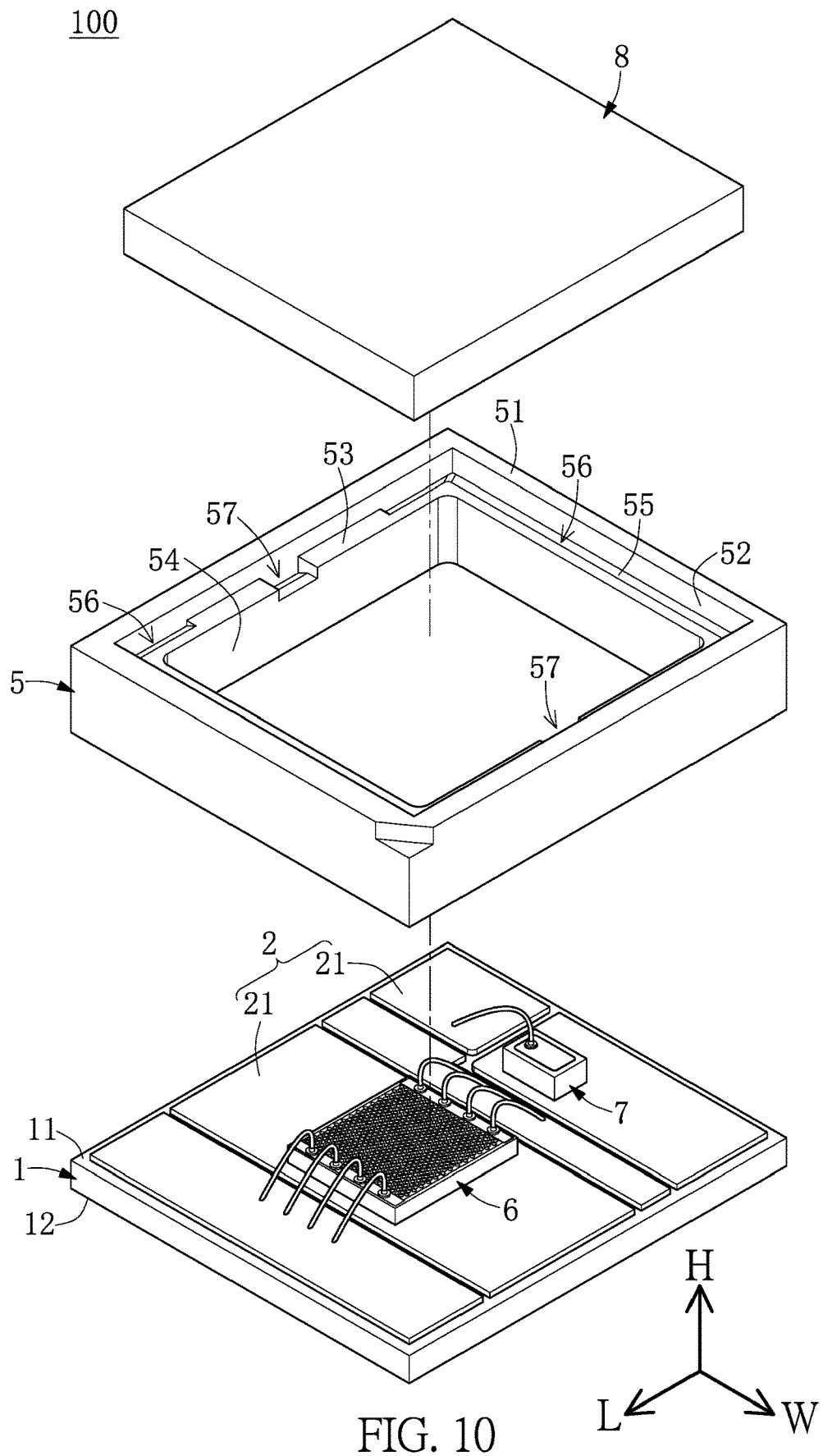
FIG. 10 is an exploded view of a light source device with an adhesive omitted according to a third embodiment of the present disclosure.
Figure 11:
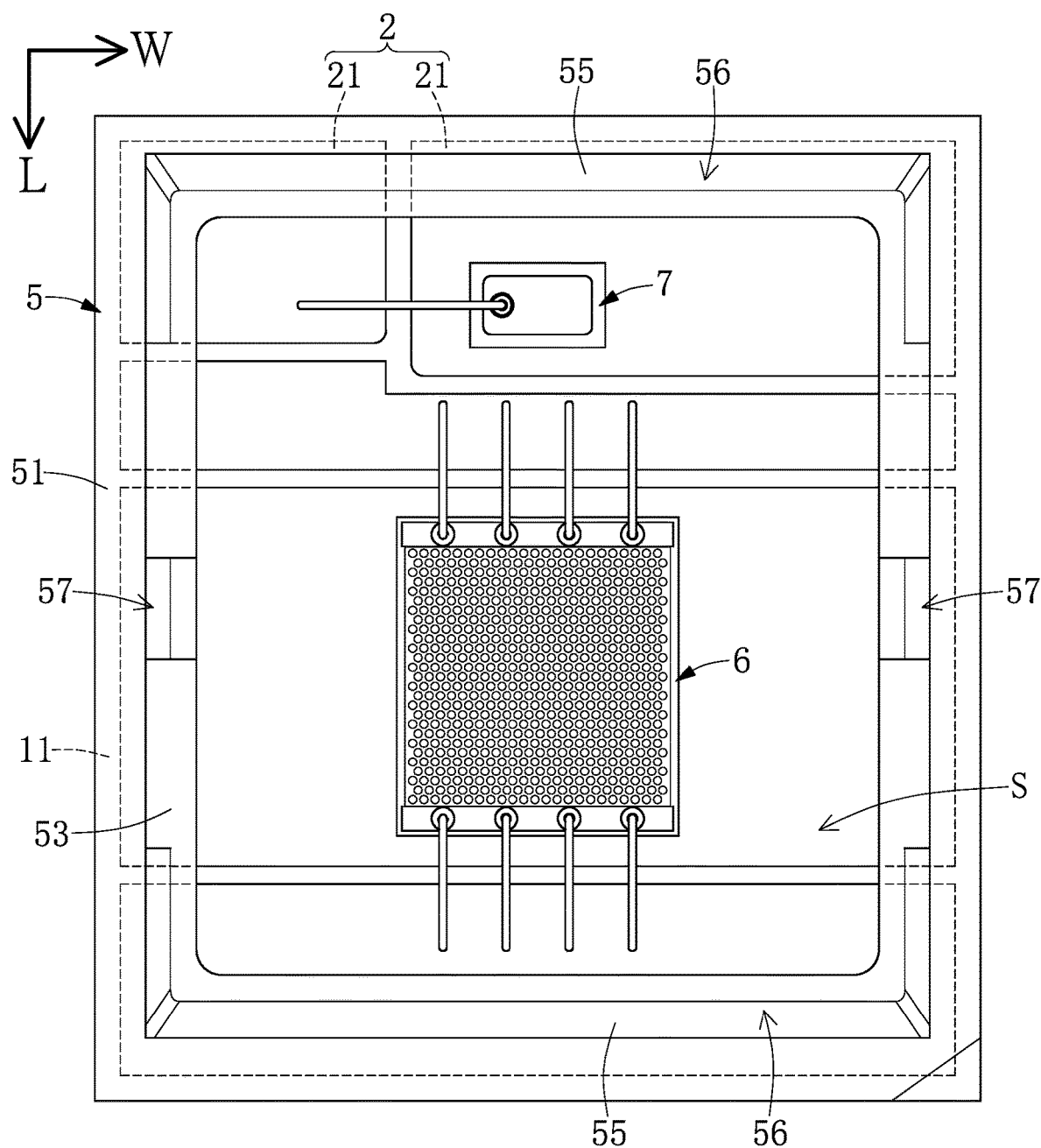
FIG. 11 is a top view of FIG. 10 with the adhesive and a light permeable member both omitted.

As shown in FIG. 5 to FIG. 7, the substrate 1 in the present embodiment is substantially in a rectangular shape or a square shape and defines a longitudinal direction L, a width direction W, and a height direction H, which are orthogonal to each other, so as to facilitate the description of the relative positions of the components of the light source device 100. The substrate 1 of the present embodiment is an insulating substrate, such as a ceramic board or a printed circuit board, and includes a first surface 11 and a second surface 12 opposite to the first surface 11.

Figure 4:
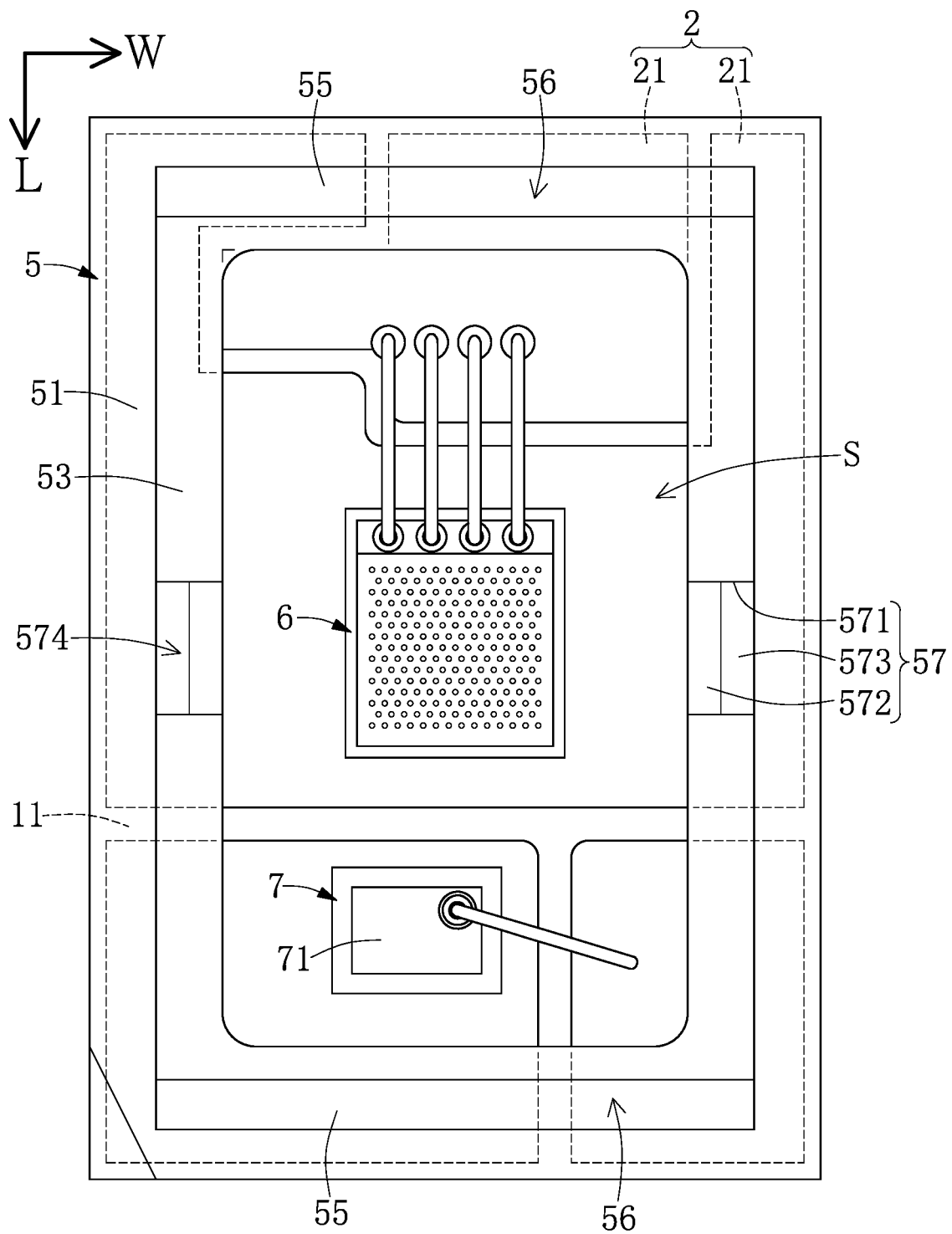
FIG. 4 is a top view of FIG. 1 with the adhesive and a light permeable member both omitted.

The electrode layer 2 is disposed on the first surface 11 of the substrate 1, and includes a plurality of electrode pads 21 spaced apart from each other. The electrode pads 21 preferably correspond in geometrical shape to each other, thereby covering at least 80% of an area of the first surface 11. However, the shape of each of the electrode pads 21 can be adjusted or changed according to design requirements, and is not limited to those shown in the drawings. As shown in FIG. 4, the electrode layer 4 includes four electrode pads 21, two of the four electrode pads 21 are provided for die-bonding and wire-bonding of the light detector 7, and the other two of the four electrode pads 21 are provided for die-bonding and wire-bonding of the light emitter 6.

The soldering layer 3 is disposed on the second surface 12 of the substrate 1 and includes a plurality of metallic pads 31 spaced apart from each other. Moreover, each of the conductive posts 4 embedded in the substrate 1 has two ends respectively connected to the electrode layer 2 and the soldering layer 3, thereby establishing an electrical connection between the electrode layer 2 and the soldering layer 3. Specifically, a middle one of the metallic pads 31 is provided for heat dissipation, and the other metallic pads 31 respectively arranged at two opposite sides of the middle metallic pad 31 are configured to be positive electrodes and negative electrodes of the light emitter 6 and the light detector 7. In other words, the four metallic pads 31 at the two opposite sides of the middle metallic pad 31 are respectively and electrically coupled to the four electrode pads 21 through the conductive posts 4.

As shown in FIG. 5 to FIG. 7, the surrounding frame 5 is disposed on the first surface 11 of the substrate 1, and outer lateral sides of the surrounding frame 5 are preferably flush with outer lateral sides of the substrate 1. A periphery portion of the electrode layer 2 (e.g., a portion of each of the electrode pads 21) is embedded in the surrounding frame 5. The surrounding frame 5 is formed in an annular step-like structure, and in the present embodiment, is integrally formed as a one-piece structure, but the present disclosure is not limited thereto. For example, in other embodiments of the present disclosure, the surrounding frame 5 and the substrate 1 can be integrally formed as a one-piece structure.

Specifically, the surrounding frame 5 sequentially includes an upper tread 51, an upper riser 52 connected to an inner edge of the upper tread 51, a lower tread 53, and a lower riser 54 connected to an inner edge of the lower tread 53. The upper tread 51, the upper riser 52, the lower tread 53, and the lower riser 54 are arranged from an outer side to an inner side of the surrounding frame 5. Moreover, the surrounding frame 5 in the present embodiment includes two slanting surfaces 55 each connected to the upper riser 52 and the lower tread 53, and the two slanting surfaces 55 are respectively connected to two opposite edges of the lower tread 53 (e.g., two short edges of the lower tread 53 shown in FIG. 4).

The upper tread 51 is in a rectangular and annular shape or a square and annular shape, and is arranged away from the substrate 1. The upper tread 51 in the present embodiment is a top surface of the surrounding frame 5, and is preferably parallel to the first surface 11 of the substrate 1. The upper riser 52 is in a rectangular and annular shape or a square and annular shape, and is perpendicularly connected to the inner edge of the upper tread 51. The lower tread 53 is in a rectangular and annular shape or a square and annular shape, and is arranged at an inner side of the upper riser 52. The lower tread 53 is preferably parallel to the upper tread 51, and a distance D53 between the lower tread 53 and the first surface 11 is less than a distance D51 between the upper tread 51 and the first surface 11. The lower riser 54 is in a rectangular and annular shape or a square and annular shape. The lower riser 54 is perpendicularly connected to the inner edge of the lower tread 53, and is arranged away from the upper tread 51. The lower riser 54 and the first surface 11 of the substrate 1 jointly and surroundingly form an accommodating space S. Moreover, an edge of each of the two slanting surfaces 55 (e.g., an inner edge of each of the two slanting surfaces 55 shown in FIG. 6) is connected to the lower tread 53 so as to jointly form an angle more than 90 degrees, and another edge of each of the two slanting surfaces 55 (e.g., an outer edge of each of the two slating surfaces 55 shown in FIG. 6) is connected to the upper riser 52 so as to jointly form a receiving groove 56 having an angle less than 90 degrees. In other words, the positions of the two receiving grooves 56 are opposite to each other along the longitudinal direction L, but the present disclosure is not limited thereto. For example, in other embodiments of the present disclosure, the surrounding frame 5 can be formed with at least one slanting surface 55 and at least one receiving groove 56 corresponding in position to the at least one slanting surface 55, or the surrounding frame 5 can be formed without any slanting surface 55 and any receiving groove 56.

As shown in FIG. 5 to FIG. 7, the surrounding frame 5 is recessed from the lower tread 53 and the lower riser 54 to form two notches 57 that are in spatial communication with the accommodating space S. The positions of the two notches 57 are opposite to each other along the width direction W. In the present embodiment, the two notches 57 are respectively located at centers of two long edges of the lower tread 53. That is to say, the two receiving grooves 56 and the two notches 57 of the surrounding frame 5 respectively correspond in position to four edges of the lower tread 53, but the present disclosure is not limited thereto. For example, in other embodiments of the present disclosure, the surrounding frame 5 can form at least one notch 57.

Specifically, as shown in FIG. 4 and FIG. 7, each of the two notches 57 includes two inner walls 571 facing and spaced apart from each other, a flat bottom wall 572, and a slanting bottom wall 573. The flat bottom wall 572 and the slanting bottom wall 573 are arranged between the two inner walls 571. In each of the two notches 57, each of the two inner walls 571 is perpendicularly connected to the upper tread 52, and a distance D572 between the flat bottom wall 572 and the first surface 11 is less than the distance D53 between the lower tread 53 and the first surface 11. Moreover, in each of the two notches 57, an edge of the slanting bottom wall 573 (e.g., an inner edge of the slanting bottom wall 573 shown in FIG. 7) is connected to the flat bottom wall 572 so as to jointly form an angle more than 90 degrees, and another edge of the slanting bottom wall 573 (e.g., an outer edge of the slanting bottom wall 573 shown in FIG. 7) is connected to the upper riser 52 so as to jointly form a slot 574 having an angle less than 90 degrees. The slot 574 is in a V-shape for receiving dust or particles, thereby preventing dust or particles from entering into the accommodating space S.

As shown in FIG. 5 to FIG. 7, the light emitter 6 in the present embodiment is a Vertical-Cavity Surface-Emitting Laser (VCSEL) for providing an infrared light having wavelength of 850 nm or 940 nm, and the light detector 7 in the present embodiment is a photodiode (PD), but the present disclosure is not limited thereto. The light detector 7 is configured to monitor light signal (e.g., laser light) emitted from the light emitter 6 so as to prevent the light signal from harming eyes, thereby providing an eye protection function.

The light emitter 6 and the light detector 7 are arranged in the accommodating space S (or are arranged inside of the surrounding frame 5), the light emitter 6 is preferably disposed on a center portion of the first surface 11, and the light emitter 6 and the light detector 7 are preferably arranged along the longitudinal direction L, but the present disclosure is not limited thereto. The light detector 7 in the present embodiment has a light receiving region 71 in a rectangular shape, and a longitudinal direction of the light receiving region 71 is perpendicular to a longitudinal direction of the surrounding frame 5 (i.e., the longitudinal direction L defined by the substrate 1), such that the light signal detected by the light detector 7 can be provided for more accuracy.

Figure 12:
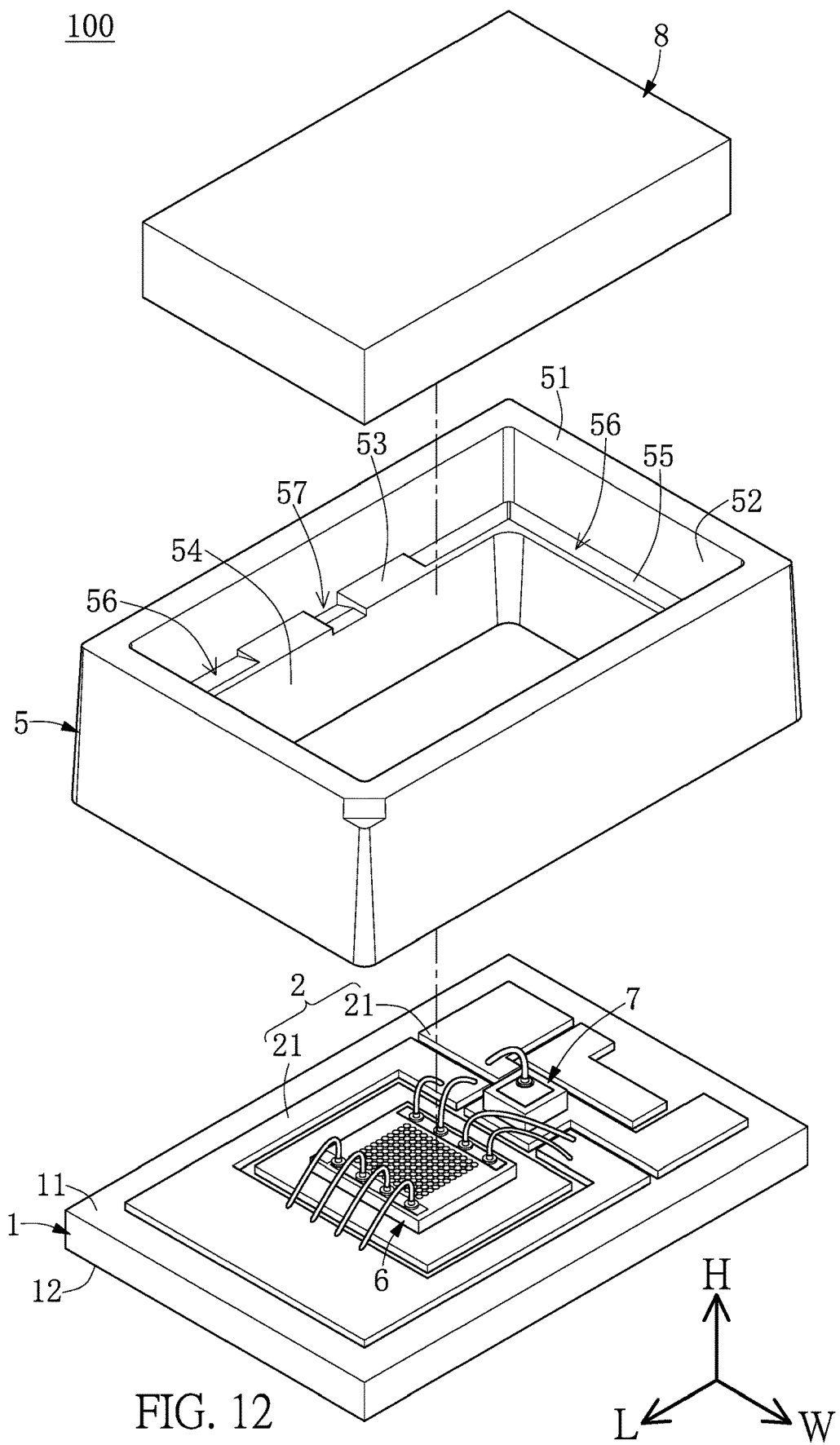
FIG. 12 is an exploded view of a light source device with an adhesive omitted according to a fourth embodiment of the present disclosure.

As shown in FIG. 5 to FIG. 7, the light permeable member 8 in the present embodiment includes a transparent glass board 81 and a light-diffusion polymer layer 82 formed on the transparent glass board 81. The light permeable member 8 is disposed on the lower tread 53 of the surrounding frame 5 and is spaced apart from the upper riser 52 (i.e., the light permeable member 8 does not contact the upper riser 52), so that each of the two notches 57 is formed as an air channel in spatial communication with the accommodating space S and an external space. Moreover, a protruding part of the light permeable member 8 protrudes from the upper tread 51 of the surrounding frame 5, and a volume of the protruding part is more than 50% of a total volume of the light permeable member 8, but the present disclosure is not limited thereto. For example, as shown in FIG. 12, the light permeable member 8 does not protrude from the upper tread 51 of the surrounding frame 5. That is to say, the top surface of the light permeable member 8 can be slightly higher than or slightly lower than the upper tread 51 of the surrounding frame 5.

In other words, the light permeable member 8 is disposed on the surrounding frame 5 and covers the light emitter 6 and the light detector 7, and the light-diffusing polymer layer 82 faces the light emitter 6 and the light detector 7. The light emitter 6 includes a light emitting surface 61, and a projection area defined by orthogonally projecting the light emitting surface 61 onto the light permeable member 8 is located on an inner side of an external contour of the light permeable member 8. Specifically, the light-diffusing polymer layer 82 includes a plurality of optical microstructures 821 facing the light emitter 6 and the light detector 7. A projection area defined by orthogonally projecting the light emitting surface 61 of the light emitter 6 onto the light-diffusing polymer layer 82 is located on an inner side of an external contour of the optical microstructures 821. It should be noted that the optical microstructures 821 in the present embodiment are in a periodic arrangement, but the present disclosure is not limited thereto. For example, in other embodiments of the present disclosure, the optical microstructures 821 can be in a non-periodic arrangement.

Moreover, the light permeable member 8 in the present embodiment is fixed onto the lower tread 53 of the surrounding frame 5 through the adhesive 9, and the connection between the light permeable member 8 and the lower tread 53 can be gapless by the adhesive 9. Each of the two receiving grooves 56 of the surrounding frame 5 is configured to receive a part of the adhesive 9 (e.g., a part of the adhesive 9 overflowing from the light permeable member 8 and the lower tread 53).

Figure 13:
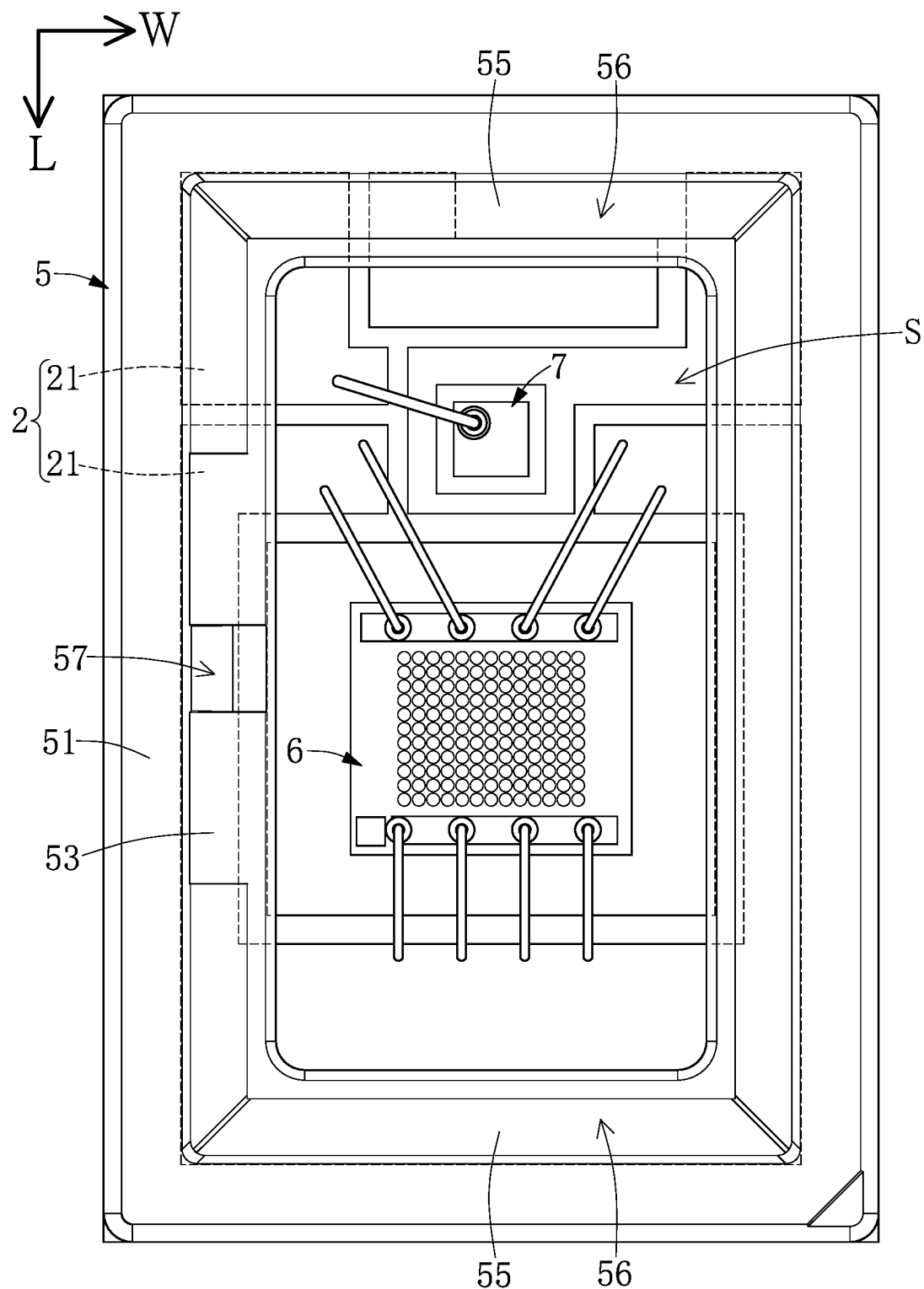
FIG. 13 is a top view of FIG. 12 with the adhesive and a light permeable member both omitted.

In addition, the light source device 100 of the present embodiment is described by the above components, but the structure of the light source device 100 can be adjusted or changed according to design requirements. For example, the inside structure of the light source device 100 can be adjusted according to other embodiments shown in FIG. 8 to FIG. 13. As shown in FIG. 8 to FIG. 11, the receiving groove 56 is in a U-shape (i.e., the connection area of the slanting surface 55 and the upper tread 52 is in a U-shape), and a part of the adhesive 9 in the two receiving grooves 56 can be used to connect the light permeable member 8. As shown in FIG. 12 and FIG. 13, the surrounding frame 5 of the light source device 100*a* can include only one notch 57, the receiving groove 56 can be in a C-shape (i.e., the connection area of the slanting surface 55 and the upper tread 52 is in a C-shape), and a part of the adhesive 9 in the C-shaped receiving groove 56 can be used to connect the light permeable member 8.

The above description discloses the structure of each component of the light source device 100, 100*a*. However, during a producing process, a transporting process, or in-use of the light source device 100, 100*a*, the light permeable member 8 may have a crack or a rupture (i.e., the light permeable member 8 is damaged), upon which the light permeable member 8 may be in one of two conditions according to the degree of damage of the light permeable member 8. One of the two conditions is where the damage is acceptable, such that light emitted from the light emitter 6 does not harm human eyes, and the other is where the damage is unacceptable, such that light emitted from the light emitter 6 will harm the human eyes (e.g., when the light permeable member 8 is damaged to uncover the light emitter 6, light emitted from the light emitter 6 will harm the human eyes).

Accordingly, in order to effectively evaluate the damage of the light permeable member 8 for preventing the light emitter 6 from emitting light to harm human eyes, the light source device 100, 100*a* includes the following features for achieving eye safety. The following description takes the light source device 100 shown in FIG. 1 to FIG. 7 for example, but the present disclosure is not limited thereto.

Figure 14:
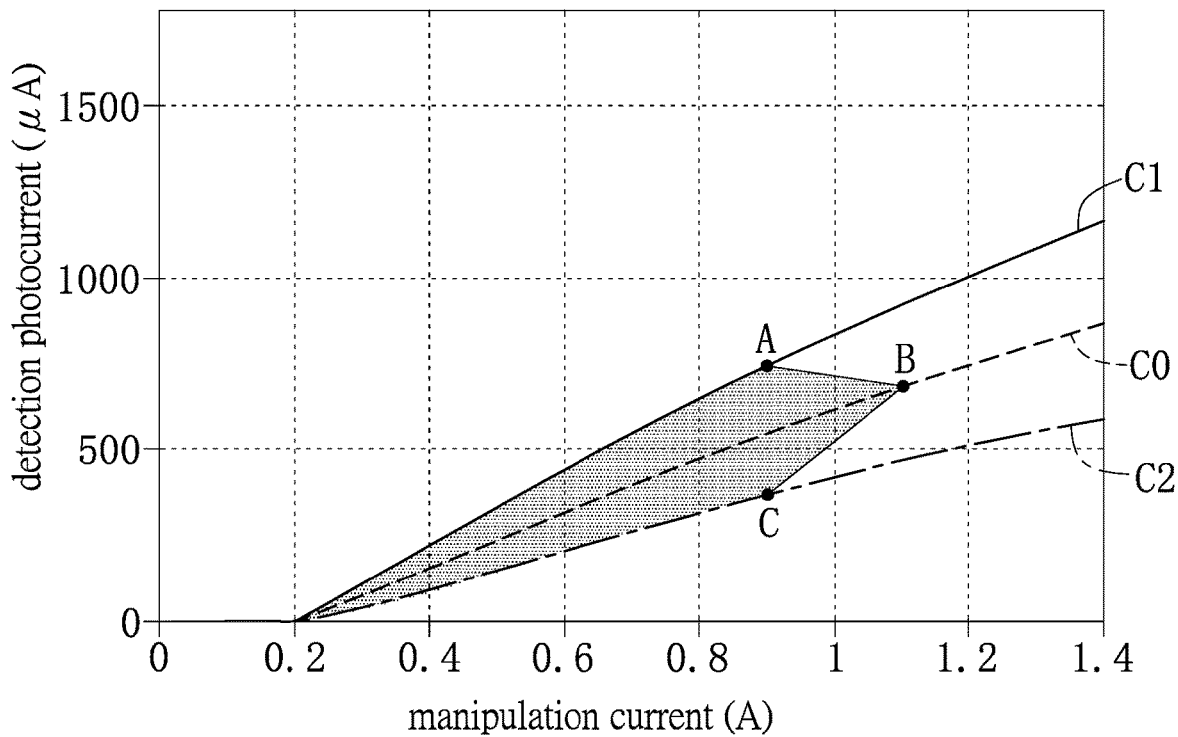
FIG. 14 is a curve diagram showing a relationship between a detection photocurrent and a manipulation current when the manipulation current received by the light source device of FIG. 1 is a direct current.

Referring to FIG. 14, which is a functional chart showing a relationship between a detection photocurrent and a manipulation current when the manipulation current received by the light source device 100 of FIG. 1 is a direct current. When the light emitter 6 receives a predetermined current, the light emitter 6 emits an invisible light that is invisible to the naked eye toward the light permeable member 8, and the light detector 7 receives a part of the invisible light reflected from the light permeable member 8 so as to generate an initial photocurrent (e.g., a curved line C0 shown in FIG. 14). It should be noted that when the light permeable member 8 is damaged, light angle and brightness reflected from the light permeable member 8 will be affected according to the damaged situation of the light permeable member 8. Accordingly, a detection photocurrent generated from the light detector 7 can approximately exhibit the degree of damage of the light permeable member 8 to serve as a reference for whether the light source device 100 will harm the human eyes or not.

Moreover, when the light emitter 6 receives a manipulation current so that a detection photocurrent generated from the light detector 7 is less than a first proportion of the initial photocurrent C0 or greater than a second proportion of the initial photocurrent C0, the light source device 100 may harm human eyes due to the damaged light permeable member 8, so that the light emitter 6 stops receiving the manipulation current. On the contrary, when a detection photocurrent generated from the light detector 7 is between the first proportion and the second proportion of the initial photocurrent C0, the light source device 100 satisfies Class 1 requirement of IEC 60825 standard.

Figure 15:
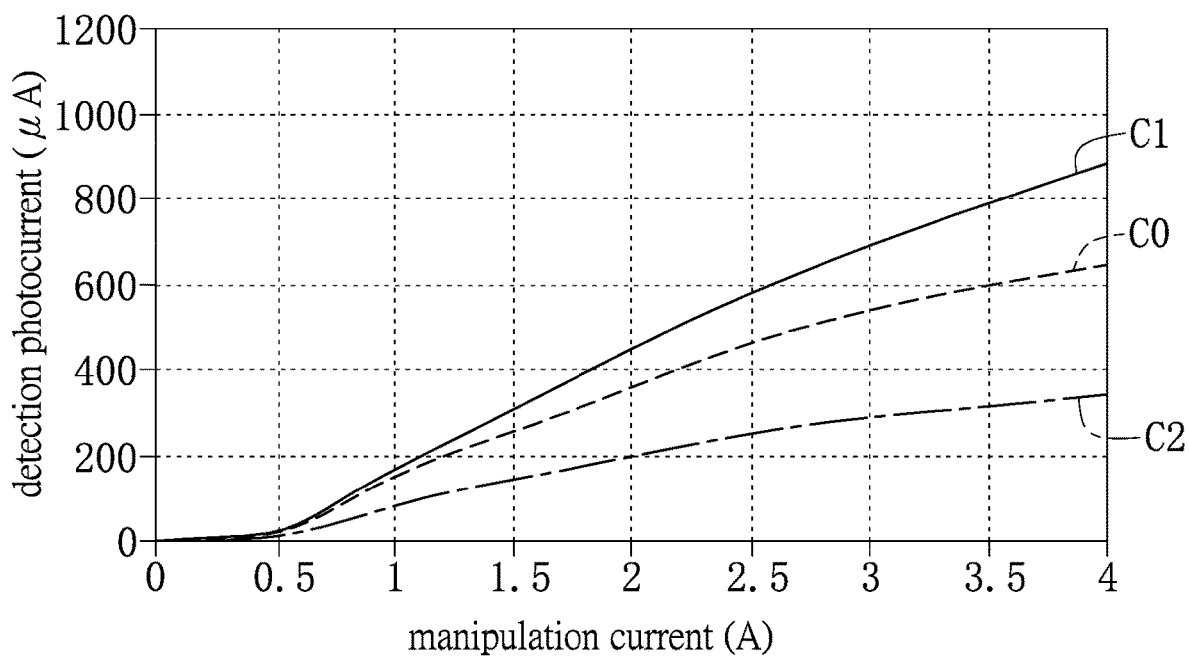
FIG. 15 is a curve diagram showing a relationship between a detection photocurrent and a manipulation current when the manipulation current received by the light source device of FIG. 12

As shown in FIG. 14, in the light source device 100 shown in FIG. 1 to FIG. 7, the first proportion is 70% and the second proportion is 136%. That is to say, when the detection photocurrent generated from the light detector 7 is less than 70% of the initial photocurrent C0 or greater than 136% of the initial photocurrent C0, the light source device 100 will harm human eyes due to the damaged light permeable member 8. However, the first proportion and the second proportion of the present disclosure are not limited to the above values. For example, as shown in FIG. 15, in the light source device 100 shown in FIG. 12 and FIG. 13, the first proportion is 52.3% and the second proportion is 130.8%.

Specifically, when the manipulation current is in different current modes, the light source device 100 has to include corresponding features for satisfying Class 1 requirement of IEC 60825 standard, and the above corresponding features are disclosed as follows.

As shown in FIG. 14, under a premise about the detection photocurrent generated from the light detector 7 is between the first proportion and the second proportion of the initial photocurrent C0, when the manipulation current is a direct current (DC), the manipulation current received by the light source device 100 is less than 1.2 A, and a power of the light source device 100 is equal to or less than 3.79 mW, but the present disclosure is not limited thereto. The manipulation current preferably satisfies an enclosed region shown in FIG. 14, and the enclosed region includes boundary points as follows: the manipulation current is 0.9 A and the power of the light source device 100 is 3.65 mW (e.g., the point A shown in FIG. 14), the manipulation current is 1.1 A and the power of the light source device 100 is 3.52 mW (e.g., the point B shown in FIG. 14), and the manipulation current is 0.9 A and the power of the light source device 100 is 3.53 mW (e.g., the point C shown in FIG. 14).

Moreover, the light source device 100 can be adjusted by structural design (e.g., the relationship between the light permeable member 8 and other components) for preventing the light source device 100 from harming human eyes due to the damaged light permeable member 8. Specifically, when the manipulation current is a direct current, the manipulation current is limited to an accessible emission limit (AEL) of the light source device 100 with a maximum criteria limitation and a minimum criteria limitation. The light permeable member 8 covering the light detector 7 and the light emitter 6 is defined as the maximum criteria limitation, and the light permeable member 8 covering the light emitter 6 is defined as the minimum criteria limitation. A coverage of the light permeable member 8 under the maximum criteria limitation is greater than that under the minimum criteria limitation. In other words, when the light permeable member 8 is damaged, the maximum criteria limitation refers to that at least part of the light permeable member 8 is still directly above the light detector 7 and the light emitter 6, and the minimum criteria limitation refers to that at least part of the light permeable member 8 is still directly above the light emitter 6.

Moreover, as shown in FIG. 14, when the manipulation current is a direct current (unit: A), the manipulation current is defined as x, and the detection photocurrent is defined as y. In the maximum criteria limitation (e.g., a curved line C1 shown in FIG. 14), the manipulation current and the detection photocurrent satisfy: $y = -0.0002x^2 + 1.2873x - 264.86$. In the minimum criteria limitation (e.g., a curved line C2 shown in FIG. 14), the manipulation current and the detection photocurrent satisfy: $y=-0.0001x^2+0.7039x-178.65$.

Figure 16:
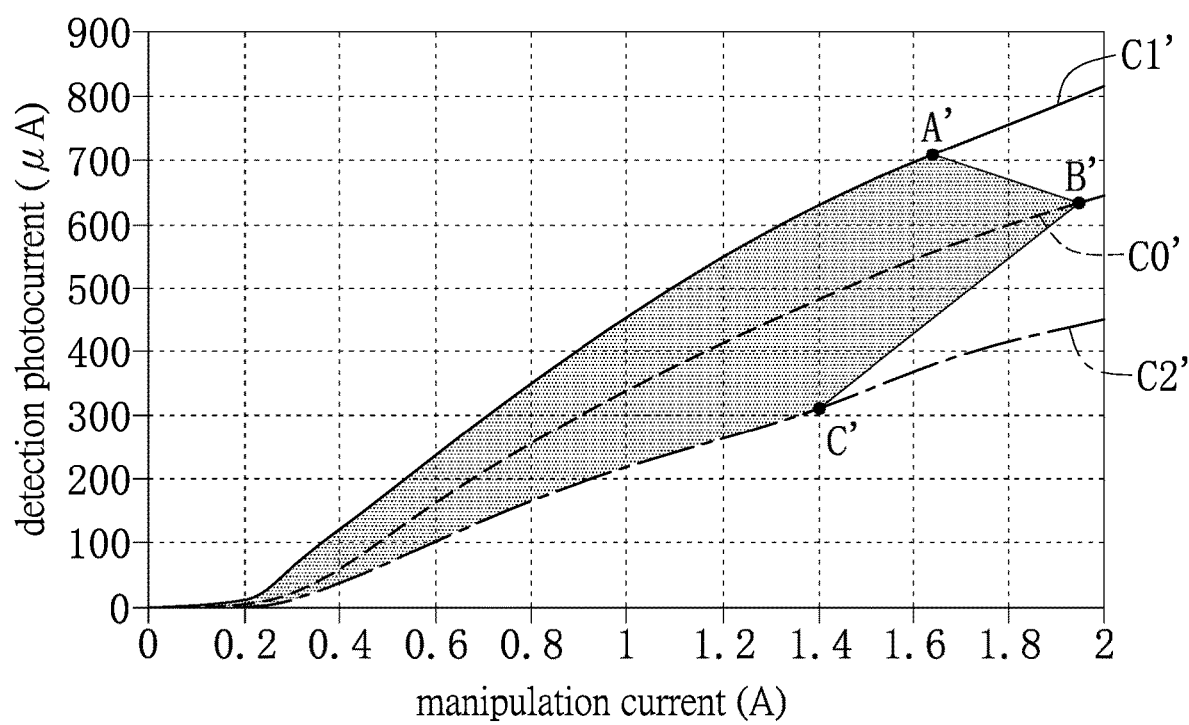
FIG. 16 is a curve diagram showing a relationship between a detection photocurrent and a manipulation current when the manipulation current received by the light source device of FIG. 1 is a pulse current having a duty cycle of 54%.

In addition, as shown in FIG. 16, under the premise that the detection photocurrent generated from the light detector 7 is between the first proportion and the second proportion of the initial photocurrent C0, when the manipulation current is a pulse current, the manipulation current received by the light source device 100 is equal to or less than 1.2 A, and a power of the light source device 100 is equal to or less than 3.79 mW. When a duty cycle of the manipulation current is 54%, the manipulation current preferably satisfies an enclosed region shown in FIG. 16, and the enclosed region includes boundary points as follows: the manipulation current is 1.7 A and the power of the light source device 100 is 3.53 mW (e.g., the point A' shown in FIG. 16), the manipulation current is 2 A and the power of the light source device 100 is 3.54 mW (e.g., the point B' shown in FIG. 16), and the manipulation current is 1.4 A and the power of the light source device 100 is 3.53 mW (e.g., the point C' shown in FIG. 16).

Moreover, the light source device 100 can be adjusted by structural design (e.g., the relationship between the light permeable member 8 and other components) for preventing the light source device 100 from harming human eyes due to the damaged light permeable member 8. Specifically, when the manipulation current is a pulse current having a duty cycle, the manipulation current is limited to an AEL of the light source device 100 and the duty cycle both with a maximum criteria limitation and a minimum criteria limitation. The light permeable member 8 covering the light detector 7 and the light emitter 6 is defined as the maximum criteria limitation, and the light permeable member 8 covering the light emitter 6 is defined as the minimum criteria limitation. A coverage of the light permeable member 8 under the maximum criteria limitation is greater than that under the minimum criteria limitation. In other words, when the light permeable member 8 is damaged, the maximum criteria limitation refers to that at least part of the light permeable member 8 is still directly above the light detector 7 and the light emitter 6, and the minimum criteria limitation refers to that at least part of the light permeable member 8 is still directly above the light emitter 6.

Figure 17:
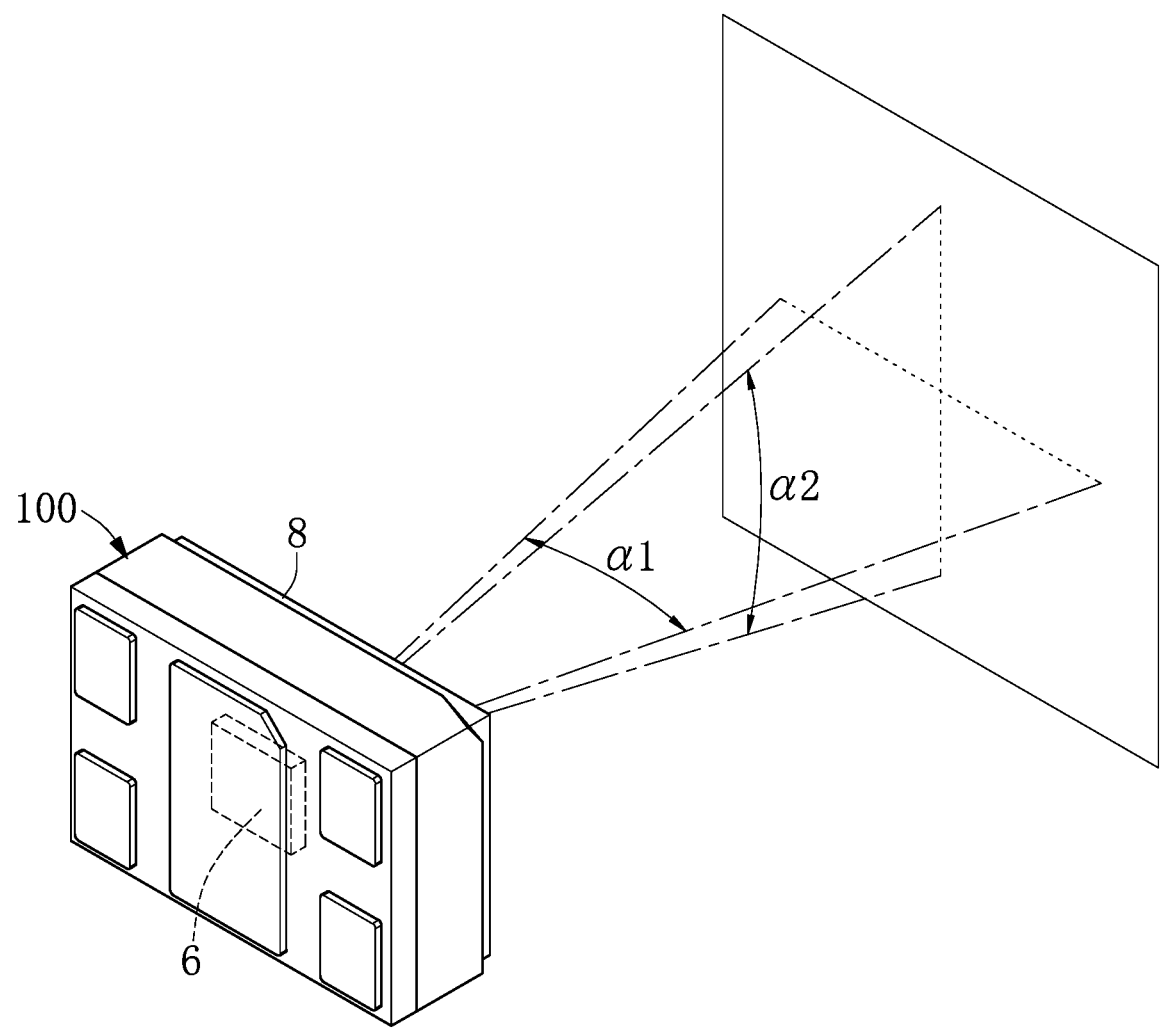
FIG. 17 is perspective view showing the light source device of FIG. 1 in a usage mode.

It should be noted that in order to ensure the light source device 100 satisfies Class 1 requirement of IEC 60825 standard, the light source device 100 preferably includes at least part of the following features. As shown in FIG. 17, the light source device 100 has a working distance of 100 mm, an aperture of 7 mm, and a power that is less than or equal to 3.79 mW. Moreover, the invisible light emitted from the light emitter 6 passes through the light permeable member 8 to form a first far field divergence angle $\alpha 1$ with respect to a horizontal direction and to form a second far field divergence angle $\alpha 2$ with respect to a vertical direction. The first far field divergence angle $\alpha 1$ is within a range of 40-115 degrees, and the second far field divergence angle $\alpha 2$ is within a range of 40-115 degrees.

Figure 18:
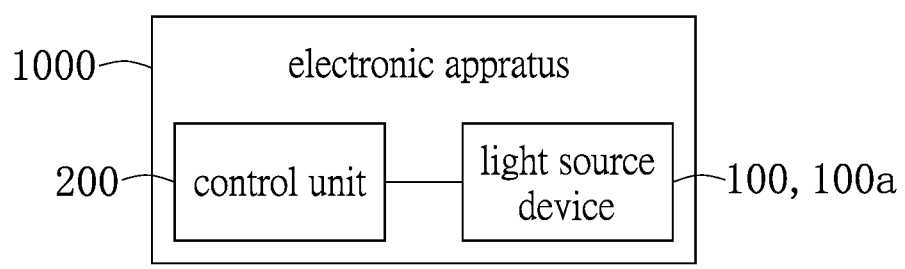
FIG. 18 is a block diagram of an electronic apparatus according to the present disclosure.

In addition, as shown in FIG. 18, the present disclosure also provides an electronic apparatus 1000 including the light source device 100 and a control unit 200. The control unit 200 is electrically coupled to the light detector 7 of the light source device 100, and is configured to control the manipulation current to be provided to the light emitter 6. When the detection photocurrent generated from the light detector 7 is less than the first proportion of the initial photocurrent C0 or greater than the second proportion of the initial photocurrent C0, the light emitter 6 stops receiving the manipulation current by the control unit 200. Moreover, when the detection photocurrent generated from the light detector 7 is between the first proportion and the second proportion of the initial photocurrent C0, the light source device 100 satisfies Class 1 requirement of IEC 60825 standard.

In conclusion, since the surrounding frame 5 of the light source device 100, 100a of the present disclosure is formed with a specific structure, the accommodating space S arranged in the surrounding frame 5 can be in spatial communication with an external space through the notch 57, thereby achieving different requirements.

Moreover, the surrounding frame 5 of the light source device 100, 100a of the present disclosure can also form a slanting surface 55 connected to the upper riser 52 and the lower tread 53 so as to form the receiving groove 56 having an angle less than 90 degrees, so that the light source device 100, 100a can use the receiving groove 56 to receive a part of the adhesive 9.

In addition, the light source device 100, 100a of the present disclosure can be used to determine the operation of the light emitter 6 according to a detection photocurrent generated from the light detector 7, thereby preventing the light emitter 6 from emitting light passing through the damaged light permeable member 8 to harm human eyes. Moreover, the light source device 100, 100a can be applied to any apparatus for eye safety (e.g., the electronic apparatus 1000).

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source device, comprising:
   a substrate including a first surface and a second surface opposite to the first surface;
   an electrode layer disposed on the first surface of the substrate;
   a surrounding frame disposed on the first surface;
   a light emitter and a light detector mounted on the electrode layer and spaced apart from each other, and located on an inner side of the surrounding frame; and
   a light permeable member disposed on the surrounding frame and covering the light emitter and the light detector,
   wherein when the light emitter receives a predetermined current, the light emitter emits an invisible light toward the light permeable member, and the light detector receives a part of the invisible light reflected from the light permeable member so as to generate an initial photocurrent,
   wherein when the light emitter receives a manipulation current so that a detection photocurrent generated from the light detector is less than a first proportion of the initial photocurrent or greater than a second proportion of the initial photocurrent, the light emitter stops receiving the manipulation current.

2. The light source device according to claim 1, wherein the first proportion is 52.3% and the second proportion is 130.8%.

3. The light source device according to claim 1, wherein the invisible light emitted from the light emitter passes through the light permeable member to form a first far field divergence angle along a horizontal direction and to form a second far field divergence angle along a vertical direction, and wherein the first far field divergence angle is within a range of 40-115 degrees, and the second far field divergence angle is within a range of 40-115 degrees.

4. The light source device according to claim 1, wherein when the detection photocurrent generated from the light detector is between the first proportion and the second proportion of the initial photocurrent, the light source device satisfies Class 1 requirement of IEC 60825 standard.

5. The light source device according to claim 1, wherein the light source device satisfies Class 1 requirement of IEC 60825 standard by having a working distance of 100 mm, an aperture of 7 mm, and a power that is less than or equal to 3.79 mW.

6. The light source device according to claim 1, wherein the light emitter is a Vertical-Cavity Surface-Emitting Laser (VCSEL) configured to emit an infrared light.

7. The light source device according to claim 1, wherein when the manipulation current is a direct current (DC), the manipulation current is less than 1.2 A, and a power of the light source device is equal to or less than 3.79 mW.

8. The light source device according to claim 7, wherein the manipulation current is limited to an accessible emission limit (AEL) of the light source device with a maximum criteria limitation and a minimum criteria limitation, and wherein the light permeable member covering the light detector and the light emitter is defined as the maximum criteria limitation, the light permeable member covering the light emitter is defined as the minimum criteria limitation, and a coverage of the light permeable member under the maximum criteria limitation is greater than that under the minimum criteria limitation.

9. The light source device according to claim 8, wherein the manipulation current is defined as x, and the detection photocurrent is defined as y, wherein in the maximum criteria limitation, the manipulation current and the detection photocurrent satisfy: $y=-0.0002x^2+1.2873x-264.86$, and wherein in the minimum criteria limitation, the manipulation current and the detection photocurrent satisfy: $y=-0.0001x^2+0.7039x-178.65$.

10. The light source device according to claim 1, wherein when the manipulation current is a pulse current having a duty cycle, the manipulation current is equal to or less than 2 A, and a power of the light source device is equal to or less than 3.79 mW.

11. The light source device according to claim 10, wherein the manipulation current is limited to an AEL of the light source device and the duty cycle both with a maximum criteria limitation and a minimum criteria limitation, and wherein the light permeable member covering the light detector and the light emitter is defined as the maximum criteria limitation, the light permeable member covering the light emitter is defined as the minimum criteria limitation, and a coverage of the light permeable member under the maximum criteria limitation is greater than that under the minimum criteria limitation.

12. The light source device according to claim 1, wherein the light detector has a light receiving region in a rectangular shape, and a longitudinal direction of the light receiving region is perpendicular to a longitudinal direction of the surrounding frame.

13. The light source device according to claim 1, wherein the light permeable member includes a light permeable glass board and a light-diffusing polymer layer disposed on the light permeable glass board, and the light-diffusing polymer layer faces the light emitter and the light detector.

14. The light source device according to claim 13, wherein the light-diffusing polymer layer includes a plurality of optical microstructures facing the light emitter and the light detector, and wherein the light emitter includes a light emitting surface, and a projection area defined by orthogonally projecting the light emitting surface onto the light-diffusing polymer layer is located on an inner side of an external contour of the optical microstructures.

15. An electronic apparatus, comprising:
a light source device according to claim 1; and
a control unit electrically coupled to the light detector of the light source device and configured to control the manipulation current to be provided to the light emitter, wherein when the detection photocurrent generated from the light detector is less than the first proportion of the initial photocurrent or greater than the second proportion of the initial photocurrent, the light emitter stops receiving the manipulation current by the control unit.

16. A light source device, comprising:
a substrate including a first surface and a second surface opposite to the first surface;
an electrode layer disposed on the first surface of the substrate;
a surrounding frame disposed on the first surface;
a light emitter and a light detector mounted on the electrode layer and spaced apart from each other, and located on an inner side of the surrounding frame; and
a light permeable member disposed on the surrounding frame and covering the light emitter and the light detector,
wherein when the light emitter receives a predetermined current, the light emitter emits an invisible light toward the light permeable member, and the light detector receives a part of the invisible light reflected from the light permeable member so as to generate an initial photocurrent,
wherein when the light emitter receives a manipulation current so that a detection photocurrent generated from the light detector is less than a first proportion of the initial photocurrent or greater than a second proportion of the initial photocurrent, the light emitter stops receiving the manipulation current, and wherein the first proportion is 70% and the second proportion is 136%.

* * * * *